(12) United States Patent
Shin et al.

(10) Patent No.: US 11,940,725 B2
(45) Date of Patent: Mar. 26, 2024

(54) PHASE SHIFT BLANKMASK AND PHOTOMASK FOR EUV LITHOGRAPHY

(71) Applicant: S&S TECH Co., Ltd., Daegu-si (KR)

(72) Inventors: Cheol Shin, Daegu-si (KR); Yong-Dae Kim, Daegu-si (KR); Jong-Hwa Lee, Daegu-si (KR); Chul-Kyu Yang, Daegu-si (KR); Min-Kwang Park, Daegu-si (KR); Mi-Kyung Woo, Daegu-si (KR)

(73) Assignee: S&S Tech Co., Ltd., Daegu (KR)

( * ) Notice: Subject to any disclaimer, the term of this patent is extended or adjusted under 35 U.S.C. 154(b) by 123 days.

(21) Appl. No.: 17/543,534

(22) Filed: Dec. 6, 2021

(65) Prior Publication Data

US 2022/0236635 A1 Jul. 28, 2022

(30) Foreign Application Priority Data

Jan. 27, 2021 (KR) .......................... 10-2021-0011135
Apr. 26, 2021 (KR) .......................... 10-2021-0053875
Jun. 15, 2021 (KR) .......................... 10-2021-0077681

(51) Int. Cl.
  *G03F 1/32* (2012.01)
  *G03F 1/24* (2012.01)

(52) U.S. Cl.
  CPC . *G03F 1/32* (2013.01); *G03F 1/24* (2013.01)

(58) Field of Classification Search
  CPC ..... G03F 1/24; G03F 1/32; G03F 1/28; G03F 1/58; H01L 21/0332; H01L 21/0337
  See application file for complete search history.

(56) References Cited

U.S. PATENT DOCUMENTS

| | | | | |
|---|---|---|---|---|
| 7,771,895 B2 * | 8/2010 | Wu | ........................ | B82Y 40/00 |
| | | | | 430/394 |
| 10,481,484 B2 * | 11/2019 | Ikebe | ........................ | G03F 1/26 |
| 2003/0039923 A1 | 2/2003 | Mangat et al. | | |
| 2004/0175629 A1 | 9/2004 | Wasson et al. | | |
| 2007/0148559 A1 | 6/2007 | Yoo | | |
| 2017/0038673 A1 | 2/2017 | Ikebe et al. | | |

(Continued)

FOREIGN PATENT DOCUMENTS

| CN | 1991577 A | 7/2007 | | |
|---|---|---|---|---|
| EP | 3422099 A1 * | 1/2019 | ............... | G03F 1/26 |

(Continued)

*Primary Examiner* — Mark F. Huff
*Assistant Examiner* — Moriah S. Smoot
(74) *Attorney, Agent, or Firm* — William Park & Associates Ltd.

(57) ABSTRACT

A blankmask for EUV lithography includes a substrate, a reflective layer, a capping layer, and a phase shift layer. The phase shift layer is made of a material containing ruthenium (Ru) and chromium (Cr), and a total content of ruthenium (Ru) and chromium (Cr) is 50 to 100 at %. The phase shift layer may further contain boron (B) or nitrogen (N). The phase shift layer of the present invention has a high relative reflectance (relative reflectance with respect to a reflectance of the reflective layer under the phase shift layer) with respect to a tantalum (Ta)-based phase shift layer and has a phase shift amount of 170 to 230°. It is possible to obtain excellent resolution when finally manufacturing a pattern of 7 nm or less by using a photomask manufactured using such a blankmask.

34 Claims, 7 Drawing Sheets

(56) References Cited

U.S. PATENT DOCUMENTS

| | | |
|---|---|---|
| 2017/0052441 A1 | 2/2017 | Lu et al. |
| 2018/0088456 A1* | 3/2018 | Kosaka .............. C23C 14/0089 |
| 2018/0329285 A1 | 11/2018 | Hamamoto et al. |
| 2019/0079383 A1 | 3/2019 | Ikebe |
| 2021/0208498 A1 | 7/2021 | Ikebe et al. |
| 2021/0223681 A1 | 7/2021 | Ikebe et al. |
| 2022/0011662 A1 | 1/2022 | Komizo et al. |

FOREIGN PATENT DOCUMENTS

| | | | |
|---|---|---|---|
| JP | 2006519420 A | 8/2006 | |
| JP | 2017181571 A | 10/2017 | |
| JP | 2019086802 A * | 6/2019 | ............. C03C 15/00 |
| JP | 2020181206 A | 11/2020 | |
| KR | 20180127197 A * | 11/2018 | |
| TW | 201421147 A | 6/2014 | |
| TW | 201525607 A | 7/2015 | |
| TW | 201901282 A | 1/2019 | |
| TW | 202004327 A | 1/2020 | |
| TW | 202013057 A | 4/2020 | |
| WO | 2019225736 A1 | 11/2019 | |
| WO | 2019225737 A1 | 11/2019 | |
| WO | WO-2019225736 A1 * | 11/2019 | ............... G03F 1/24 |
| WO | WO-2019225737 A1 * | 11/2019 | ............... G06F 1/24 |
| WO | 2020100632 A1 | 5/2020 | |

* cited by examiner

PHASE SHIFT BLANKMASK AND PHOTOMASK FOR EUV LITHOGRAPHY

CROSS-REFERENCE TO RELATED APPLICATION

This application is based on and claims priority under 35 U. S. C. § 119 to Korean Patent Application Nos. 10-2021-0011135, filed on Jan. 27, 2021, 10-2021-0053875, filed on Apr. 26, 2021, and 10-2021-0077681, filed on Jun. 15, 2021, the disclosure of which is herein incorporated by reference in their entirety.

TECHNICAL FIELD

The present invention relates to a phase shift blankmask and a photomask, and more particularly, to a phase shift blankmask for extreme ultraviolet (EUV) lithography including phase shift layer for shifting a phase with respect to EUV exposure light, and a photomask manufactured using the same.

BACKGROUND ART

Recently, lithography technology for manufacturing semiconductor is evolving from ArF, ArFi, and multiple (MP) lithography technologies to EUV lithography technology. The EUV lithography technology is technology that is in the limelight for manufacturing semiconductor devices of 10 nm or less because the EUV lithography enables resolution improvement and process simplification by using an exposure wavelength of 13.5 nm.

Meanwhile, the EUV lithography technology may not use the existing refractive optical system such as photolithography using KrF or ArF light because EUV light is well absorbed by all materials, and a refractive index of a material at the wavelength is close to 1. For this reason, in the EUV lithography, a reflective photomask using a reflective optical system is used.

The blankmask is a raw material of the photomask, and is configured to include two thin films on a substrate to form a reflective structure: a multi-layer reflective layer reflecting EUV light and an absorbing layer absorbing EUV light. The photomask is manufactured by patterning the absorbing layer of the blankmask, and uses a principle of forming a pattern on a wafer by using the difference in contrast between a reflectance of the reflective layer and a reflectance of the absorbing layer.

Meanwhile, in recent years, there is a need to develop a blankmask for manufacturing semiconductor devices of 10 nm or less, in particular, 7 nm or 5 nm or less, and 3 nm or less in the future. However, when using a current binary photomask in a process of 5 nm or less, for example, nm, there is a problem in that double patterning lithography (DPL) technology needs to be applied. Accordingly, development of a phase shift blankmask capable of realizing a higher resolution than a binary blankmask including an absorbing layer as described above is being attempted.

FIG. 1 is a diagram illustrating a basic structure of a phase shift blankmask for extreme ultraviolet lithography. The phase shift blankmask for extreme ultraviolet lithography is configured to include a substrate 102, a reflective layer 104 stacked on the substrate 102, a phase shift layer 108 formed on the reflective layer 104, and a resist layer 110 formed on the phase shift layer 108.

In the phase shift blankmask for EUV lithography as described above, the phase shift layer 108 is generally easy to manufacture a photomask, and it is preferable to use a material having excellent performance during wafer printing. For example, a tantalum (Ta)-based material may be considered as a phase shift layer material. However, since the tantalum (Ta)-based material has a relatively high refractive index (high n) and a high extinction coefficient (high k), it is difficult to implement the required reflectance and phase shift amount. Specifically, the tantalum (Ta)-based material may be generally formed to have a thickness of 55 to 65 nm to realize a phase amount of about 180°, but is difficult to have a high wafer printing effect as the phase shift layer 108 because a relative reflectance of the reflective layer 104 is less than 5%. Therefore, when the required reflectance for the phase shift layer 108 is high, the tantalum (Ta) is not suitable as a material of the phase shift layer 108.

Meanwhile, the phase shift layer 108 is preferably configured in an amorphous form in order to improve pattern fidelity during etching.

In general, the stress of the thin film is represented by total indicated reading ($\Delta$TIR). In the process of forming a pattern of a thin film, a release phenomenon of thin film stress causes a change in pattern registration. These problems occur differently depending on the pattern size and density. In order to effectively control these pattern size and density, it is necessary to make the thin film have low stress.

In addition, the phase shift layer 108 is required to have a low surface roughness. In the case of the existing binary blankmask, the reflectance to exposure light is low, and therefore, the effect of diffuse reflection due to the surface roughness is relatively insignificant, but the effect of diffuse reflection increases as the phase shift layer requires a reflectance of 5% or more. For example, when the surface roughness of the phase shift layer increases, the reflectance may be reduced due to the diffuse reflection of exposure light or the contrast may be reduced due to the flare phenomenon of reflected light, and a line edge roughness (LER) and a line width roughness (LWR) of a wafer PR pattern may deteriorate.

DISCLOSURE

Technical Problem

The present invention provides a phase shift blankmask for EUV lithography capable of satisfying high reflectance and an appropriate phase shift amount required for a phase shift layer.

In addition, the present invention provides a high-quality phase shift blankmask for EUV lithography capable of improving characteristics such as contrast, LER, and LWR during wafer printing by controlling a surface roughness of a phase shift layer.

Technical Solution

According to the present invention, a blankmask for extreme ultraviolet lithography includes: a substrate; a reflective layer formed on the substrate; and a phase shift layer formed on the reflective layer, in which the phase shift layer is made of a material containing ruthenium (Ru) and chromium (Cr).

A total content of ruthenium (Ru) and chromium (Cr) in the phase shift layer may be 50 to 100 at %.

The phase shift layer may be made of a material further containing at least one of molybdenum (Mo), silicon (Si), and titanium (Ti).

The phase shift layer may be made of a material further containing boron (B). In this case, the content of boron (B) may be 5 to 50 at %.

The phase shift layer may be made of a material further containing at least one of nitrogen (N), oxygen (O), carbon (C), and hydrogen (H).

The phase shift layer may be made of a material further containing 45 at % or less of nitrogen (N).

The phase shift layer may be formed by using a sputtering target having a composition ratio of Ru:Cr=40 to 99 at %:1 to 60 at %, or a sputtering target having a composition ratio of Ru:Cr:B=40 to 95 at %:1 to 50 at %:1 to 20 at %.

The phase shift layer may be configured so that the content of Cr is greater than that of Ru, and thus, in extreme ultraviolet exposure light having a wavelength of 13.5 nm, a relative reflectance with respect to a reflectance of the reflective layer may be 3 to 15%.

The phase shift layer may be configured so that the content of Cr is less than or equal to that of Ru, and thus, in the extreme ultraviolet exposure light having a wavelength of 13.5 nm, the relative reflectance with respect to the reflectance of the reflective layer may be 15 to 30%.

The phase shift layer may have a phase shift amount of 170 to 220°.

The phase shift layer may have a thickness of 30 to 70 nm.

The phase shift layer may have a flatness of 300 nm or less.

The phase shift layer may have a roughness of 0.5 nmRMS or less.

A hard mask made of any one of Si, SiO, SiN, SiC, SiON, SiCO, SiCN, and SiCON may be formed on the phase shift layer.

The phase shift layer may have a multi-layer structure of two or more layers. An uppermost layer of the phase shift layer may be made of a material further containing oxygen (O), and a layer under the uppermost layer may be made of a material not containing oxygen (O). The content of oxygen (O) in the uppermost layer may be 1 to 60 at %. The uppermost layer may have a thickness of 1 to 10 nm. The uppermost layer may be made of any one of Si, SiN, SiC, SiO, SiCN, SiCO, SiNO, and SiCON, any one of TaO, TaCO, TaON, and TaCON, or any one of RuTaO, RuTaON, RuTaBO, and RuTaBON. A hard mask made of any one of Cr, CrN, CrC, CrO, CrCN, CrON, CrCO, and CrCON may be formed on the uppermost layer.

When the phase shift layer has a multi-layer structure of two or more layers, the uppermost layer of the phase shift layer may be made of any one of CrO, CrCO, CrON, and CrCON. The hard mask made of any one of Si, SiO, SiN, SiC, SiON, SiCO, SiCN, and SiCON may be formed on the phase shift layer.

In the phase shift layer, an etch rate may increase toward a lower portion or an etch rate at a lower portion of the phase shift layer may be greater than that of at least some of other portions. To this end, the phase shift layer may be configured so that the content of Cr gradually decreases downward, or the phase shift layer may have a multi-layer structure of two or more layers, but the phase shift layer may be formed so that a lowermost layer of the phase shift layer is made of a material that has less Cr than at least one of other layers or does not contain Cr.

An etch stop layer having an etch selectivity for the phase shift layer may be formed between the reflective layer and the phase shift layer. The etch stop layer may be made of a material containing at least one of silicon (Si), molybdenum (Mo), chromium (Cr), titanium (Ti), tungsten (W), tantalum (Ta), niobium (Nb), and ruthenium (Ru), or made of a compound in which at least one of oxygen (O), nitrogen (N), carbon (C), hydrogen (H), and boron (B) is added to the material.

A capping layer made of a material containing ruthenium (Ru) may be formed between the reflective layer and the etch stop layer. In this case, the etch stop layer may be made of a material containing tantalum (Ta) and oxygen (O).

The etch stop layer may be formed in a structure of two or more layers. In this case, the uppermost layer of the etch stop layer may be made of a material containing tantalum (Ta) and oxygen (O), and a layer under the uppermost layer of the etch stop layer is made of a material containing tantalum and not containing oxygen (O).

When a capping layer is formed on the reflective layer, the phase shift layer may include a first layer made of a material containing tantalum (Ta) and serving as an etch stop layer for the capping layer under the phase shift layer, and a second layer formed on the first layer, made of a material containing ruthenium (Ru) and chromium (Cr), and controlling the reflectance and phase shift amount of the phase shift layer.

The first layer may be made of a material further containing at least one of boron (B), niobium (Nb), titanium (Ti), molybdenum (Mo), and chromium (Cr). The first layer may be made of a material further containing at least one of nitrogen, carbon, and oxygen. The first layer may have the content of nitrogen of 50 at % or less. The first layer may have the content of Ta of 50 at % or less.

The first layer may have a thickness of 7 nm or less.

The first layer may be made of a material further containing boron (B), and thus, it is easy to implement so that the relative reflectance of the phase shift layer with respect to the reflective layer is 14 to 15%.

The first layer may be made of a material further containing niobium (Nb), and thus, it is easy to implement so that the relative reflectance of the phase shift layer with respect to the reflective layer is 20% or more.

Meanwhile, according to the present invention, there is provided a photomask manufactured using the blankmask for extreme ultraviolet lithography having a configuration as described above.

Advantageous Effects

According to the present invention, there is provided a phase shift blankmask for extreme ultraviolet lithography including a phase shift layer having a high relative reflectance (relative reflectance with respect to a reflectance of a reflective layer under a phase shift layer) with respect to a tantalum (Ta)-based phase shift layer and having a phase shift amount of 170 to 230°. Further, according to the present invention, there is provided a phase shift blankmask for extreme ultraviolet lithography in which a surface roughness of a phase shift layer is 0.5 nmRMS or less, and further, 0.3 nmRMS or less.

It is possible to obtain excellent resolution when finally manufacturing a pattern of 7 nm or less by using a photomask manufactured using such a blankmask.

BEST MODE

Hereinafter, the present invention will be described in more detail with reference to the drawings.

Figure 1:
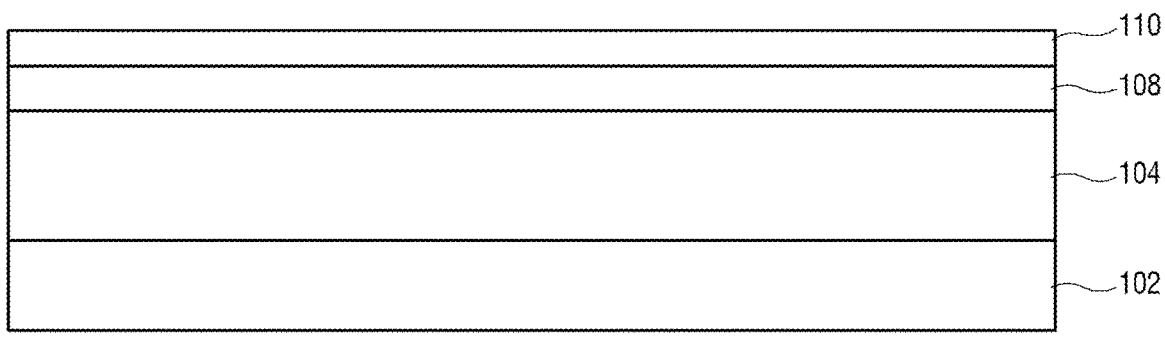
FIG. 1 is a diagram illustrating a basic structure of a conventional phase shift blankmask for extreme ultraviolet lithography.
Figure 2:
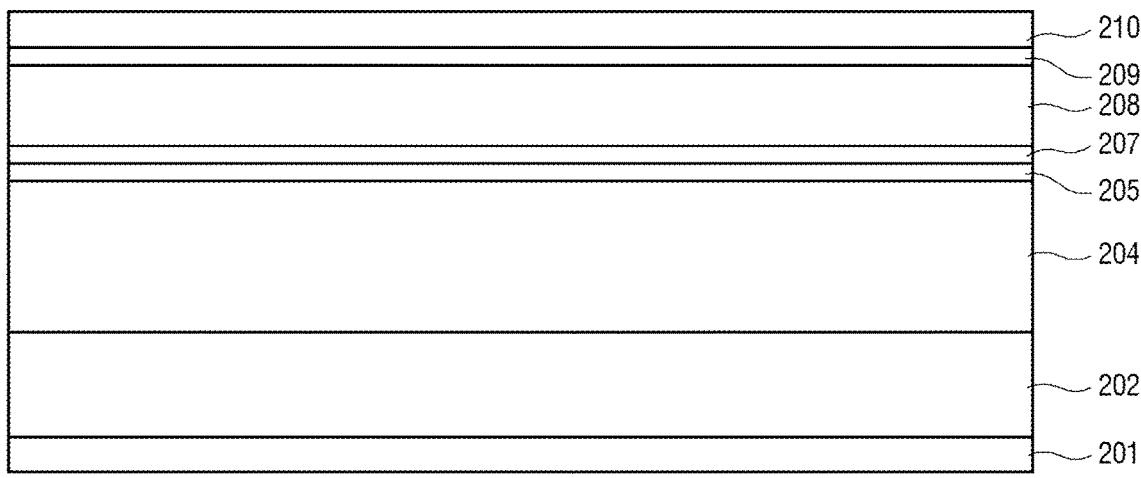
FIG. 2 is a diagram illustrating a phase shift blankmask for extreme ultraviolet lithography according to the present invention.

FIG. 2 is a diagram illustrating a phase shift blankmask for extreme ultraviolet lithography according to the present invention.

A phase shift blankmask for extreme ultraviolet lithography according to the present invention includes a substrate 202, a reflective layer 204 stacked on the substrate 202, a capping layer 205 stacked on the reflective layer 204, a phase shift layer 208 stacked on the capping layer 205, a hard mask layer 209 stacked on the phase shift layer 208, and a resist layer 210 stacked on the hard mask layer 209, and a resist layer 210 stacked on the hard mask layer 209. In addition, the blankmask according to the present invention may further include a conductive layer 201 formed on a rear surface of the substrate 202, and an etch stop layer 207 formed between the capping layer 205 and the phase shift layer 208. In addition, an absorbing layer (not illustrated) may be additionally provided between the phase shift layer 208 and the resist layer 210.

The substrate 202 is formed of a low thermal expansion material (LTEM) substrate having a low coefficient of thermal expansion of 0±1.0×10$^{-7}$/° C. and preferably 0±0.3×10$^{-7}$/° C. to prevent pattern deformation and stress caused by heat during exposure so that the substrate 202 is suitable as a glass substrate for a reflective blankmask using EUV exposure light. As the material of the substrate 202, SiO$_2$—TiO$_2$-based glass, multi-component-based glass ceramic, or the like may be used.

The substrate 202 requires a low level of flatness in order to control a pattern position error of reflected light during exposure. The flatness is represented by a total indicated reading (TIR) value, and the substrate 202 preferably has a low TIR value. The flatness of the substrate 202 is 100 nm or less and preferably 50 nm or less in an area of 132 mm$^2$ or an area of 142 mm$^2$.

The reflective layer 204 serves to reflect the EUV exposure light, and has a multi-layer structure having different refractive indexes of each layer. Specifically, the reflective layer 204 is formed by alternately stacking 40 to 60 layers of Mo and Si layers. An uppermost layer of the reflective layer 204 is preferably formed of a protective layer of Si to prevent oxidation of the reflective layer 204.

The reflective layer 204 requires high reflectance with respect to a wavelength of 13.5 nm in order to improve image contrast. A reflection intensity of this multi-layer reflective layer varies depending on an incident angle of exposure light and a thickness of each layer. For example, when the incident angle of the exposure light is 5 to 6°, the Mo layer and the Si layer are preferably formed to have a thickness of 2.8 nm and 4.2 nm, respectively.

The reflective layer 204 preferably has a reflectance of 60% or more and preferably 64% or more, with respect to the EUV exposure light of 13.5 nm.

When the surface flatness of the reflective layer 204 is defined as total indicated reading (TIR), the TIR has a value of 1,000 nm or less, preferably 500 nm or less, and more preferably 300 nm or less. When the surface TIR of the reflective layer 204 is high, an error occurs at a position where the EUV exposure light is reflected, and as the position error increases, a pattern position error increases.

The reflective layer 204 has a surface roughness value of 0.5 nmRms or less, preferably 0.3 nmRms or less, and more preferably 0.1 nmRms or less in order to suppress diffuse reflection with respect to the EUV exposure light.

The capping layer 205 is formed on the reflective layer 204, and prevents the formation of an oxide film of the reflective layer 204 to maintain the reflectance of the reflective layer 204 with respect to the EUV exposure light, and to prevent the reflective layer from being etched during patterning of the phase shift layer 208. As a preferred example, the capping layer 205 is made of a material containing ruthenium (Ru). The capping layer 205 is preferably formed to a thickness of 2 to 5 nm. When the thickness of the capping layer 205 is 2 nm or less, it is difficult to exhibit a function as the capping layer 205, and when the thickness of the capping layer 205 is 5 nm or more, there is a problem in that reflectance for the EUV exposure light is lowered.

The etch stop layer 207 is selectively provided between the capping layer 205 and the phase shift layer 208, and serves to protect the lower capping layer 205 during a dry etching process or a cleaning process for patterning the phase shift layer 208. The etch stop layer 207 is preferably made of a material having an etch selectivity of 10 or more with respect to the phase shift layer 208.

When the etch stop layer 207 is formed, the etch stop layer 207 is patterned together with the phase shift layer 208 on the etch stop layer 207 to serve as a part of the phase shift layer 208. In this case, the reflectance of the phase shift layer 208 means the reflectance of the entire stacked structure of the etch stop layer 207 and the phase shift layer 208.

The material forming the etch stop layer 207 is determined in consideration of the fact that the etch stop layer 207 affects the entire phase shift amount and reflectance, and also the etch selectivity of the etch stop layer 207 required for the phase shift layer 208. The etch stop layer 207 may be made of a material containing at least one of silicon (Si), molybdenum (Mo), chromium (Cr), titanium (Ti), tungsten (W), tantalum (Ta), niobium (Nb), and ruthenium (Ru), or made of a compound in which at least one of oxygen (O), nitrogen (N), carbon (C), hydrogen (H), and boron (B) is added to the material.

When the phase shift layer 208 and the capping layer 205 contain the same material, for example, when the phase shift layer 208 and the capping layer 205 are made of a material containing ruthenium (Ru), the etch stop layer 207 may be made of a material with etch selectivity for ruthenium (Ru). That is, since the ruthenium (Ru)-based phase shift layer 208 generally has a property of being etched by a chlorine-based gas, the etch stop layer 207 may be made of a material etched by a fluorine-based gas. Specifically, the etch stop layer 207 may be made of a material containing at least one of silicon (Si), molybdenum (Mo), tantalum (Ta), niobium (Nb), and boron (B), or a material containing at least one of oxygen (O), nitrogen (N), and carbon (C).

When the etch stop layer 207 is made of a material containing tantalum (Ta), it is preferable that the etch stop layer further contains oxygen (O). Since tantalum (Ta) is etched by a fluorine-based gas when it contains oxygen (O), the etch stop layer 207 has an etch selectivity for the phase shift layer 208 on the etch stop layer 207. Meanwhile, when the etch stop layer 207 is formed of a single layer based on tantalum (Ta), oxidation occurs due to natural oxidation of tantalum (Ta) after the patterning. When the etch stop layer 207 including tantalum (Ta) further contains oxygen (O), it is possible to reduce an irregular surface caused by the oxidation phenomenon.

Meanwhile, when the etch stop layer 207 contains oxygen (O), the capping layer 205 made of Ru material is damaged, which affects the reduction in reflectance, etc. Therefore, it is preferable that the etch stop layer 207 is formed not to contain oxygen. Accordingly, when the etch stop layer 207 is made of a material containing tantalum (Ta), the etch stop layer 207 is formed in a structure of two or more layers, but it is preferable that the uppermost layer further contains oxygen (O) and a layer under the uppermost layer is formed not to contain oxygen (O). A lower layer of the etch stop layer 207 is etched by chlorine-based gas because the lower layer does not contain oxygen. In this case, since the capping layer 205 under the etch stop layer 207 contains ruthenium (Ru), the capping layer 205 may be etched by the chlorine-based gas. The capping layer 205 may be etched by using the chlorine-based (Cl) gas not containing oxygen (O) as an etching gas etching the lower portion of the etch stop layer 207, and thus, the etch damage to the capping layer 205 may be minimized.

The etching gas for the etch stop layer 207 may be the same as or different from the etching gas for the phase shift layer 208 formed on the etch stop layer 207. For example, when the etching gas is the same, an etching end point may be confirmed by an end point detection (EPD) system by making the composition or composition ratio of the etch stop layer 207 and the phase shift layer 208 different.

In addition, the etch stop layer 207 may be made of a material that is removed when the final pattern is formed. In order to remove the etch stop layer 207, a material from which the etch stop layer 207 is removed during dry etching, wet etching, and cleaning may be used. Specifically, the etch stop layer 207 may be removed by using SC-1, SPM, APM, Megasonic, or Hot-DI water as a cleaning solution during the cleaning.

The etch stop layer 207 has a thickness of 0.5 to 10 nm, and preferably a thickness of 1 to 7 nm. When the etch stop layer 207 has a thickness of 10 nm or more, the reflectance of the pattern of the phase shift layer 208 finally formed is reduced, and when the etch stop layer 207 has a thickness of 0.5 nm or less, it is difficult to perform a role as the etch stop layer 207.

The phase shift layer 208 shifts a phase of the exposure light and reflects the exposure light, thereby causing destructive interference with the exposure light reflected by the reflective layer 204 to extinct the exposure light. The phase shift layer 208 is made of a material having high transmittance while facilitating phase shift control with respect to a wavelength of the exposure light. As such materials, ruthenium (Ru) and chromium (Cr) are used in the present invention. The material containing Ru and Cr has excellent chemical resistance and has the advantage of being able to apply fluorine (F)-based and chlorine (Cl)-based gases, which are generally used during the dry etching. In particular, a material containing Ru and Cr may be easily etched by a chlorine-based gas. Meanwhile, the phase shift layer 208 may further contain at least one of molybdenum (Mo), silicon (Si), titanium (Ti), niobium (Nb), and boron (B) in addition to Ru and Cr.

Ru and Cr determine the reflectance and phase shift amount of the phase shift layer 208. Since Ru has a lower refractive index than Cr, the amount of phase shift of the phase shift layer 208 may be controlled by controlling the composition ratio of Ru and Cr. The sum of the contents of Ru and Cr contained in the phase shift layer 208 is preferably 50 to 100 at %. When the contents of Ru and Cr are 50 at % or less, it is difficult to secure a reflectance of 3 to 30% and control the amount of phase shift.

The ratio of Ru and Cr contained in the phase shift layer 208 is determined in consideration of the required reflectance. Since Ru has a lower extinction coefficient than Cr, when the content of Ru is relatively increased compared to the content of Cr, the reflectance of the phase shift layer 208 is increased.

When the low reflectance is required, the phase shift layer 208 is configured so that the content of Cr may be greater than the content of Ru. Specifically, it is easy to implement a relative reflectance of 3 to 15% when the phase shift layer 208 is made of Cr:Ru=50 to 99 at %:1 to 50 at %. Here, the relative reflectance means the reflectance of the phase shift layer 208 with respect to the reflectance of the reflective layer 204 including the capping layer 205. For example, when the reflectance of the reflective layer 204 including the capping layer 205 is 65% and the reflectance of the phase shift layer 208 is 3.3%, the relative reflectance of the phase shift layer 208 with respect to the reflective layer 204 is 5.08%. In the present invention, the reflectance means a reflectance with respect to EUV exposure light having a wavelength of 13.5 nm.

When the high reflectance is required, the phase shift layer 208 is configured so that the content of Cr may be less than or equal to the content of Ru. Specifically, it is easy to implement a relative reflectance of 15 to 30% when the phase shift layer 208 is made of Cr:Ru=1 to 50 at %:50 to 99 at %.

Meanwhile, the phase shift layer 208 containing Ru and Cr is preferably formed to further contain boron (B). Boron (B) makes thin film crystallinity of the phase shift layer amorphous to improve a pattern profile during pattern formation. In addition, boron (B) serves to lower the surface roughness of the thin film after sputtering as the boron (B) has a lower atomic weight than Ru and Cr. As a result, it is easy to control diffuse reflection etc., occurring on the surface of the phase shift layer 208. In addition, since boron (B) optically has a lower extinction coefficient (k) than Ru and Cr, when the phase shift layer contains boron (B), it is necessary to implement a predetermined reflectance in the range of 3 to 30% and a phase shift amount of around 180°. In addition, as the content of boron (B) increases, an etch rate of the phase shift layer 208 including Ru and Cr increases, thereby improving the pattern profile, particularly, the LER and LWR of the pattern. Ru may be etched by both the fluorine-based and chlorine-based etching gases. In particular, when etching is performed using oxygen (O) and/or argon (Ar) gas together with the chlorine-based gas, the etch rate increases. In this case, when the phase shift layer 208 contains boron (B), it is easier to increase the etch rate.

On the other hand, when the content of boron (B) is high, the boron (B) tends to be relatively vulnerable to a cleaning solution during the cleaning process. Therefore, the content of boron (B) contained in the phase shift layer 208 is preferably 5 to 50 at %.

The phase shift layer 208 may be made of a material further containing at least one of nitrogen (N), oxygen (O), carbon (C), and hydrogen (H). In particular, when the phase shift layer 208 contains nitrogen (N), an edge roughness of the pattern in the photomask finally patterned with the phase shift layer is improved. In this case, the content of nitrogen (N) is preferably controlled to 45 at % or less.

The phase shift layer 208 may be formed of a single layer or a multilayer of two or more layers.

When the phase shift layer 208 is formed in a structure of two or more layers, at least one layer may be formed in a structure in which oxygen (O) is absent and the other layers has oxygen (O). In this case, in the phase shift layer 208 having a structure of two or more layers, it is preferable that the uppermost layer contains oxygen (O) and the layer under the uppermost layer does not contain oxygen (O). As oxygen (O) is contained in the uppermost layer, the contrast for the ArF inspection wavelength of 193 nm in the uppermost layer of the phase shift layer 208 may be finally improved.

The uppermost layer of the phase shift layer 208 having a structure of two or more layers may be made of a main material of the phase shift layer 208 of the present invention as described above, that is, a material containing Ru and Cr. Specifically, the uppermost layer of the phase shift layer 208 may be made of any one of RuCrO, RuCrON, RuCrBO, and RuCrBON.

In addition, the uppermost layer may be made of a material that does not contain Ru and/or Cr. Specifically, the uppermost layer of the phase shift layer 208 may be formed of Si compounds of any one of Si, SiN, SiC, SiO, SiCN, SiCO, SiNO, and SiCON, Ta oxide compounds of TaO, TaCO, TaON, and TaCON, or Cr oxide compounds of any one of CrO, CrCO, CrON, and CrCON. In this case, the lower layer of the phase shift layer 208 except for the uppermost layer may be made of a material containing Ru and Cr, for example, any one of RuCr, RuCrN, RuCrB, and RuCrBN. When the uppermost layer and the lower layer thereof have an etch selectivity due to a difference in materials or depending on whether the uppermost layer and the lower layer thereof contains oxygen (O), the uppermost layer has an effect of reducing the reflectance at the inspection wavelength and serves as a hard mask layer for the lower layer of the uppermost layer. In this case, the hard mask layer 209 of FIG. 2 may not be separately formed.

Meanwhile, when the phase shift layer 208 is formed of a single layer, it is possible to perform the inspection using the inspection wavelength of 13.5 nm. This is because the difference in reflectance between the reflective layer 204 and the phase shift layer 208 is at least 20% or more.

Meanwhile, the lower layer of the phase shift layer 208 except for the uppermost layer may be formed of a single layer or may be formed of two or more layers.

A specific embodiment of the case in which the phase shift layer 208 has a structure of two or more layers will be described later with reference to FIGS. 3 to 7.

When the phase shift layer 208 includes the uppermost layer and the layer under the uppermost layer, the uppermost layer has a thickness of 1 to 10 nm, and preferably 2 to 5 nm. When the uppermost layer has a thickness of 1 nm or less, it is difficult to secure an etch selectivity for the layer under the uppermost layer, and when the uppermost layer has a thickness of 10 nm or more, it is difficult to reduce the thickness of the resist layer 210 for etching the uppermost layer.

The sputtering target for forming the phase shift layer 208 may be made of a RuCr alloy having a composition ratio of Ru:Cr=40 to 99 at %:1 to 60 at %, or a RuCrB material having a composition ratio of Ru:Cr:B=40 to 95 at %:1 to 50 at %:1 to 20 at %.

The phase shift layer 208 has a phase shift amount of 170 to 220°, preferably 170 to 190°, and more preferably 175 to 185°. The phase shift layer 208 preferably has an optimized phase shift amount according to the shape and size of the pattern finally formed.

As described above, when the etch stop layer 207 is formed, the reflectance and the phase shift amount mean the reflectance and phase shift amount of the entire phase shift layer 208 and etch stop layer 207.

In order to reduce a shadowing effect, the phase shift layer 208 is excellent as the thickness decreases. The phase shift layer 208 has a thickness of 30 to 70 nm, and preferably a thickness of 40 to 60 nm.

In order to reduce a charge-up phenomenon, the phase shift layer 208 is advantageous as a sheet resistance decreases. The phase shift layer 208 of the present invention has a sheet resistance of 1000Ω/□ or less, preferably 500Ω/□ or less, and more preferably 100Ω/□ or less.

The phase shift layer 208 preferably has a low flatness (ΔTIR) to reduce the effect of registration. The phase shift layer 208 of the present invention has a flatness of 300 nm or less, preferably 200 nm, and more preferably 100 nm or less.

The phase shift layer 208 preferably has a low surface roughness in order to prevent a flare phenomenon due to diffuse reflection on the surface and reduce intensity of reflected light. The phase shift layer 208 of the present invention has a roughness of 0.5 nmRMS or less, and preferably has a roughness of 0.3 nmRMS or less.

The phase shift layer 208 of the present invention has excellent chemical resistance during the cleaning of the photomask, and specifically, the phase shift layer 208 according to the present invention has a thickness change of 1 nm or less after SC-1 and SPM processes.

The hard mask layer 209 is optionally provided, and serves as an etch mask for patterning the phase shift layer 208 under the hard mask layer 209. The hard mask 209 may be made of any one of Si, SiO, SiN, SiC, SiON, SiCO, SiCN, and SiCON. The hard mask layer 209 is preferably made of a material etched by the chlorine-based gas in order to minimize byproducts generated during the etching. To this end, the hard mask layer 209 may be made of a Cr compound, specifically, any one of Cr, CrN, CrC, CrN, CrCN, CrCO, CrON, and CrCON.

The material of the hard mask layer 209 is selected to have an etch selectivity for the uppermost layer in consideration of the material of the uppermost layer of the phase shift layer 208. When the phase shift layer 208 contains Ru and Cr, the phase shift layer 208 is etched relatively quickly by a chlorine (Cl)-based etchant compared to the fluorine (F)-based gas. Therefore, the hard mask layer 209 is preferably made of a material etched by the fluorine (F)-based etching material. For example, the hard mask layer 209 may be made of a Si-based material or a material in which at least one of C, O, and N are additionally added to Si, and specifically, the hard mask layer 209 may be made of any one of Si, SiC, SiO, SiN, SiCO, SiCN, SiON, and SiCON. Preferably, the hard mask layer 209 is made of SiON. The hard mask layer 209 is preferably formed to have a thickness of 5 nm or less.

When the phase shift layer 208 has a structure of two or more layers, the hard mask layer 209 is made of a material having an etch selectivity for the uppermost layer of the phase shift layer 208. For example, when the uppermost layer of the phase shift layer 208 may be made of any one of Si, SiN, SiC, SiO, SiCN, SiCO, SiNO, and SiCON, any one of TaO, TaCO, TaON, and TaCON, or any one of RuTaO, RuTaON, RuTaBO, and RuTaBON, the hard mask layer 209 may be made of any one of Cr, CrN, CrC, CrO, CrCN, CrON, CrCO, and CrCON. In addition, when the uppermost layer is made of any one of CrO, CrCO, CrON, and CrCON, the hard mask layer may be made of any one of Si, SiO, SiN, SiC, SiON, SiCO, SiCN, and SiCON.

The resist layer 210 is formed of a chemically amplified resist (CAR). The resist layer 210 has a thickness of 40 to 100 nm, and preferably 40 to 80 nm.

The conductive layer 201 is formed on a backside of the substrate 202. The conductive layer 201 has a low sheet resistance value to serve to improve adhesion between an electronic-chuck and the blankmask for EUV, and prevent particles from being generated due to friction with the electronic-chuck. The conductive layer 201 has a sheet resistance of 100Ω/□ or less, preferably, 50Ω/□ or less, and more preferably 20Ω/□ or less.

The conductive layer 201 may be configured in the form of a single film, a continuous film, or a multi-layer film. The conductive layer 201 may be made of, for example, chromium (Cr) or tantalum (Ta) as a main component.

Hereinafter, an embodiment of a specific configuration of the phase shift layer 208 in the blankmask of FIG. 2 will be described with reference to FIGS. 3 to 7. FIGS. 3 to 7 illustrate only a portion of the phase shift layer 208 in the configuration of FIG. 2.

Figure 3:
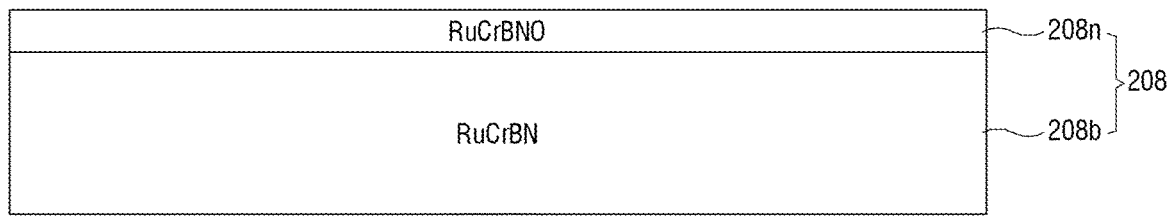
FIGS. 3 to 7 are diagrams illustrating first to fifth embodiments of a detailed configuration of a phase shift layer of FIG. 2.

In a first embodiment of FIG. 3, the phase shift layer 208 is formed of two layers of an uppermost layer 208n and a lower layer 208b, in which the lower layer 208b is made of RuCrBN and the uppermost layer 208n is made of RuCrBNO.

Meanwhile, in the case of a material containing Ru, there is a problem that the pattern profile deteriorates, and in particular, there is a problem that footing may occur in the lower portion of the pattern. In order to prevent this problem, in the phase shift layer 208, it is preferable that the etch rate increases toward the substrate 202, that is, toward the lower portion of the phase shift layer 208, or that the etch rate in the lower portion of the phase shift layer 208 is greater than at least some of the other portions of the phase shift layer 208.

To this end, in the embodiment of FIG. 3, the lower layer 208b is configured so that the content of Cr gradually decreases downward. Accordingly, the etch rate increases as the phase shift layer 208 goes downward.

Figure 4:
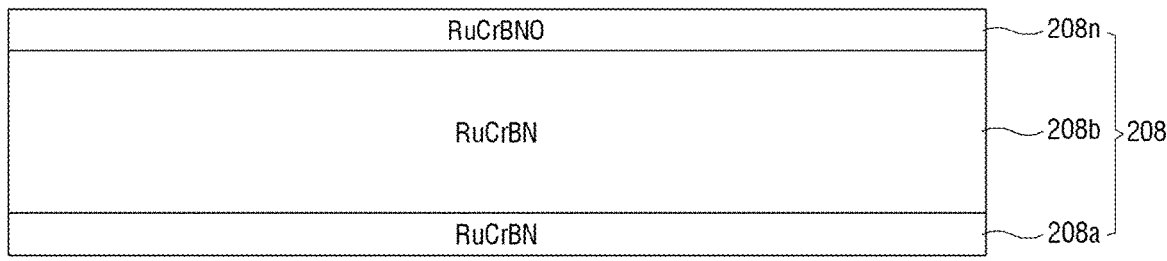
Figure 5:
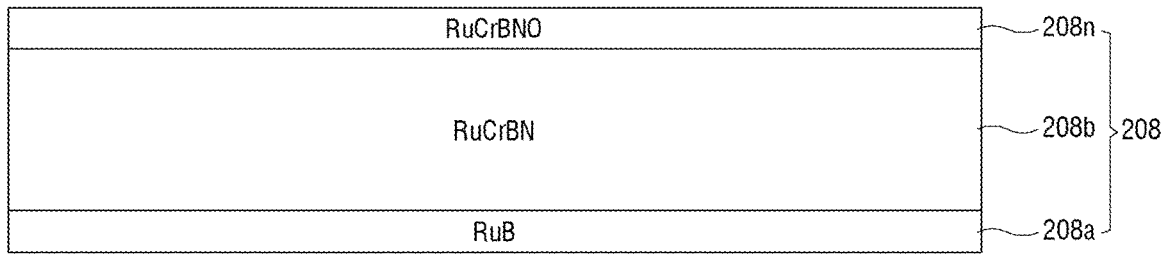

Second and third embodiments of FIGS. 4 and 5 show other specific configurations in which the pattern profile may be improved by increasing the etch rate toward the lower portion in the configuration of the embodiment of FIG. 3. In the embodiments of FIGS. 4 and 5, the phase shift layer 208 further includes a lower layer 208a in addition to the uppermost layer 208n and the lower layer 208b, and the configuration of the uppermost layer 208n and the lower layer 208b is the same as the embodiment of FIG. 3.

In FIG. 4, the lowermost layer 208a is made of the same material as the lower layer 208b, and the lowermost layer 208a contains less Cr than the lower layer 208b. When the lower layer 208b is formed of a plurality of layers, the lowermost layer 208a may have less Cr than at least any one of the plurality of layers constituting the lower layer 208b. Furthermore, in FIG. 5, the lowermost layer 208a is made of a material that does not contain Cr, and specifically, RuB or Ru.

According to the embodiments of FIGS. 3 to 5, the etch rate increases as the phase shift layer 208 goes downward, or the etch rate of the lowermost layer 208a increases compared to the layer on the phase shift layer 208, and thus, the footing of the pattern of the phase shift layer 208 is prevented.

Figure 6:
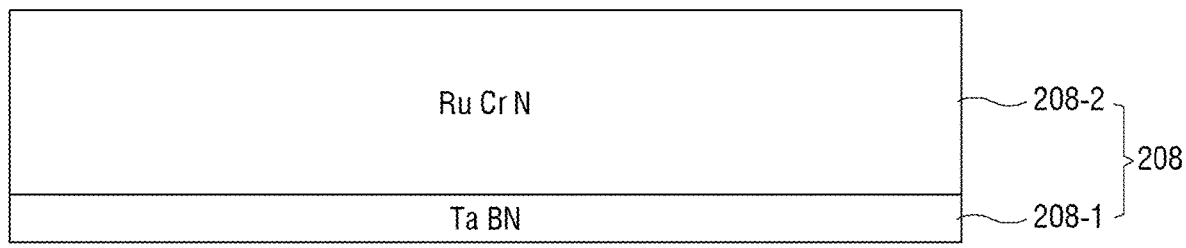

FIG. 6 is a diagram illustrating a fourth embodiment.

The phase shift layer 208 of the present embodiment has a relative reflectance of 14 to 15%. In addition, the phase shift layer 208 has a phase shift amount of 170 to 230°, and preferably has a phase shift amount of, for example, 182 to 195° in which the effect of NILS is maximized during the wafer printing.

In the present embodiment, the phase shift layer 208 is configured in a two-layer structure of a first layer 208-1 at the lowermost portion and a second layer 208-2 on the first layer 208-1. The second layer 208-2 is made of a material containing RuCr, and the first layer 208-1 is made of a material containing tantalum (Ta).

The first layer 208-1 serves to prevent damage to the lower capping layer 205 when the second layer 208-2 is etched. Since the capping layer 205 under the first layer 208-1 contains Ru and the second layer 208-2 is also made of RuCr and contains Ru, the first layer 208-1 may be etched during the etching of the second layer 208-2 of the phase shift layer 208. Accordingly, since the first layer 208-1 is made of a material having an etch selectivity for the second layer 208-2 and the capping layer 205, the first layer 208-1 serves as an etch stop layer. In this case, a separate etch stop layer 207 as in the related art of FIG. is unnecessary. Preferably, the first layer 208-1 is made of a material having an etch selectivity of 10 or more with respect to the second layer 208-2 and the capping layer 205. The first layer 208-1 has a minimum thickness required to perform an etch stop layer function, and preferably has a thickness of 7 nm or less.

The first layer 208-1 is made of tantalum (Ta) alone, or made of a material in which at least one of boron (B), niobium (Nb), titanium (Ti), molybdenum (Mo), and chromium (Cr) is added to tantalum (Ta). Furthermore, the first layer 208-1 may be made of a material in which at least one of nitrogen, carbon, and oxygen is added to the material. As an example, when the first layer 208-1 is made of a single compound of tantalum (Ta), the first layer 208-1 may be made of one of Ta, TaN, TaC, TaO, TaON, TaCO, TaCN, and TaCON.

In addition, the first layer 208-1 serves to control the reflectance and phase shift amount of the entire phase shift layer 208 including the second layer 208-2. To this end, the first layer 208-1 and the second layer 208-2 may have various combinations of compositions, composition ratios, and thicknesses. Specifically, in order to increase the reflectance of the entire phase shift layer 208, the thickness of the first layer 208-1 is controlled to 7 nm or less or 5 nm or less, or in order to decrease the extinction coefficient (k) of the entire phase shift layer 208, the first layer 208-1 may be configured to further contain boron (B). Preferably, the first layer 208-1 is made of TaBN as illustrated in FIG. 3. When the phase shift layer 208 contains boron (B), the phase shift layer 208 is easily controlled to have a relative reflectance of 14 to 15 at %.

The first layer 208-1 is preferably configured to contain 50 at % or more of Ta. When Ta is 50 at % or less, there is a problem that the etch selectivity for the second layer 208-2 and the capping layer 205 is lowered, and that the etch rate is relatively slow, and thus, it is difficult to form an excellent pattern profile. When nitrogen (N) is contained in the first layer 208-1, the content of nitrogen is preferably 50 at % or less. When nitrogen is added to tantalum (Ta), the etch rate is slowed, so the upper second layer 208-2 is damaged when the first layer 208-1 is etched. Accordingly, the first layer 208-1 contains 50 at % or less of nitrogen, so the damage to the second layer 208-2 may be prevented.

Meanwhile, the first layer 208-1 may be formed of a single layer or a multilayer. As an example, the first layer 208-1 may be formed in a two-layer structure of a lower layer made of Ta and an upper layer made of TaO.

In the etching process of the first layer 208-1, it is preferable to use an oxygen-free etching gas in order to minimize the optical loss of the lower capping layer 205 or the upper second layer 208-2.

The second layer 208-2 of the phase shift layer 208 has a thickness of 25 to 50 nm, and preferably, a thickness of 30 to 40 nm. The phase shift layer 208 is preferably configured to be 55 nm or less in total thickness. The second layer 208-2 may be formed of a single layer or a multilayer of two or more layers.

The composition of the second layer 208-2 may be the same as that of the phase shift layer 208 as described in the description of FIG. 3.

Figure 7:
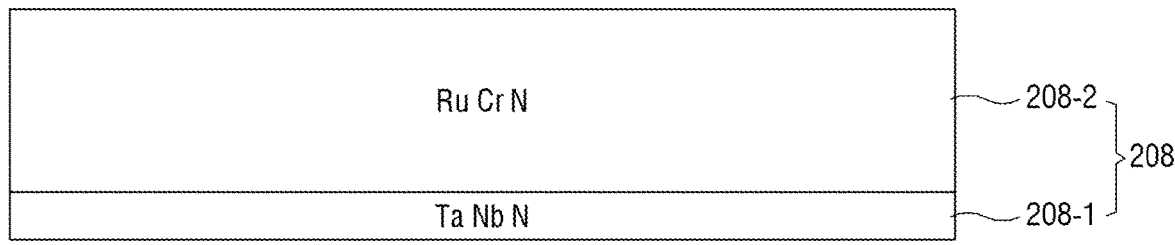

FIG. 7 is a diagram illustrating a fifth embodiment. For convenience of illustration and description, the same reference numerals as in FIG. 6 are assigned to each layer of FIG. 7. Overlapping descriptions of contents corresponding to the configuration of FIG. 7 in the contents described with respect to FIG. 6 are omitted, but these contents are equally applied to FIG. 7.

The phase shift layer 208 of the present embodiment has a relative reflectance of 20% or more. In addition, the phase shift layer 208 has a phase shift amount of 170 to 230°, and preferably has a phase shift amount of, for example, 182 to 195° in which the effect of NILS is maximized during the wafer printing.

Compared with the fifth embodiment of FIG. 7 and the embodiment of FIG. 6, the material of the first layer 208-1 is different. That is, in the embodiment of FIG. 7, the first layer 208-1 is made of TaNbN. Since Nb has a lower extinction coefficient (k) than Ta, when Nb is added to Ta, the reflectance of the first layer 208-1 may increase. Accordingly, by controlling the contents of Ta and Nb, it is possible to control the degree of control of the reflectance by the first layer 208-1. Specifically, the higher the content of Nb, the higher the reflectance of the first layer 208-1. As a result, the reflectance of the entire phase shift layer 208 increases, and thus, it is easy to implement a high relative reflectance. The first layer 208-1 has a Nb content of 1 to 50 at %, preferably 5 to 50 at %, and more preferably 10 to 40 at %, so the reflectance of the entire phase shift layer 208 may be 20% or more.

The first layer 208-1 has a minimum thickness required to perform an etch stop layer function, and preferably has a thickness of 7 nm or less. The second layer 208-2 has a thickness of 25 to 40 nm, and preferably a thickness of 30 to 32 nm.

Hereinabove, the present invention has been specifically described through examples of the present invention with reference to the drawings, but the embodiments are only used for the purpose of illustrating and explaining the present invention and are not used to limit the meaning or the scope of the present invention described in the claims. Therefore, those having ordinary skill in the technical field of the disclosure can understand that various modifications and equivalent other embodiments are possible from the embodiments. Accordingly, an actual technical scope of the present invention is to be determined by the spirit of the appended claims.

The invention claimed is:

1. A mask blank for extreme ultraviolet lithography, comprising:
   a substrate;
   a reflective layer formed on the substrate;
   a capping layer formed on the reflective layer;
   an etch stop layer formed on the capping layer; and
   a phase shift layer formed on the reflective-layer etch stop layer;
   wherein,
   the capping layer is made of a material containing ruthenium (Ru),
   the phase shift layer comprises ruthenium (Ru) and chromium (Cr), and
   the etch stop layer is formed in a structure of two or more layers, an uppermost layer of the etch stop layer is made of a material containing tantalum (Ta) and oxygen (O), and a layer under the uppermost layer of the etch stop layer is made of a material containing tantalum and not containing oxygen (O).

2. The mask blank for extreme ultraviolet lithography of claim 1, wherein a total content of ruthenium (Ru) and chromium (Cr) of the phase shift layer is 50 to 100 at %.

3. The mask blank for extreme ultraviolet lithography of claim 1, wherein the phase shift layer is made of a material further containing at least one of molybdenum (Mo), silicon (Si), and titanium (Ti).

4. The mask blank for extreme ultraviolet lithography of claim 1, wherein the phase shift layer is made of a material further containing boron (B), and the content of boron (B) is 5 to 50 at %.

5. The mask blank for extreme ultraviolet lithography of claim 4, wherein the phase shift layer is made of a material further containing at least one of nitrogen (N), oxygen (O), carbon (C), and hydrogen (H).

6. The mask blank for extreme ultraviolet lithography of claim 4, wherein the phase shift layer is made of a material further containing 45 at % or less of nitrogen (N).

7. The mask blank for extreme ultraviolet lithography of claim 1, wherein the phase shift layer is formed by using a sputtering target having a composition ratio of Ru: Cr=40 to 99 at %: 1 to 60 at %, or a sputtering target having a composition ratio of Ru: Cr: B=40 to 95 at %: 1 to 50 at %: 1 to 20 at %.

8. The mask blank for extreme ultraviolet lithography of claim 1, wherein the phase shift layer is formed so that a content of Cr is greater than that of Ru.

9. The mask blank for extreme ultraviolet lithography of claim 8, wherein the phase shift layer has a relative reflectance of 3 to 15% with respect to a reflectance of the reflective layer in extreme ultraviolet exposure light having a wavelength of 13.5 nm.

10. The mask blank for extreme ultraviolet lithography of claim 1, wherein the phase shift layer is formed so that a content of Cr is less than or equal to that of Ru.

11. The mask blank me ultraviolet lithography of claim 10, wherein the phase shift layer has a relative reflectance of 15 to 30% with respect to a reflectance of the reflective layer in extreme ultraviolet exposure light having a wavelength of 13.5 nm.

12. The mask blank for extreme ultraviolet lithography of claim 1, wherein the phase shift layer has a phase shift amount of 170 to 220°.

13. The mask blank for extreme ultraviolet lithography of claim 1, wherein the phase shift layer has a thickness of 30 to 70 nm.

14. The mask blank for extreme ultraviolet lithography of claim 1, wherein the phase shift layer has a flatness of 300 nm or less.

15. The mask blank for extreme ultraviolet lithography of claim 1, wherein the phase shift layer has a roughness of 0.5 nmRMS or less.

16. The mask blank for extreme ultraviolet lithography of claim 1, further comprising:
   a hard mask formed on the phase shift layer and made of any one of Si, SiO, SiN, SiC, SiON, SiCO, SiCN, and SiCON.

17. The mask blank for extreme ultraviolet lithography of claim 1, wherein the phase shift layer is a multi-layer structure of at least two layers,
wherein an uppermost layer of the phase shift layer is made of a material further containing oxygen (O), and a lower layer under the uppermost layer is made of a material not containing oxygen (O).

18. The mask blank for extreme ultraviolet lithography of claim 17, wherein a content of oxygen (O) in the uppermost layer is 1 to 60 at %, and has a thickness of 1 to 10 nm.

19. The mask blank for extreme ultraviolet lithography of claim 1, wherein the phase shift layer has a multi-layer structure of two or more layers, and
an uppermost layer of the phase shift layer is made of any one of CrO, CrCO, CrON, and CrCON.

20. The mask blank for extreme ultraviolet lithography of claim 19, wherein the phase shift layer is a multi-layer structure of two or more layers, the uppermost layer of the phase shift layer being made of any one of SiO, SiCN, SiCO, SiNO, SiCON, TaO, TaCO, TaON, and TaCON, RuTaO, RuTaON, RuTaBO and RuTaBON.

21. The mask blank for extreme ultraviolet lithography of claim 20, further comprising:
a hard mask formed on the uppermost layer, and made of any one of Cr, CrN, CrC, CrO, CrCN, CrON, CrCO, and CrCON.

22. The mask blank for extreme ultraviolet lithography of claim 19, further comprising:
a hard mask formed on the phase shift layer and made of any one of Si, SiO, SiN, SiC, SiON, SiCO, SiCN, and SiCON.

23. The mask blank for extreme ultraviolet lithography of claim 1, wherein in the phase shift layer, an etch rate increases toward a lower portion or an etch rate at a lower portion of the phase shift layer is greater than that of at least some of other portions.

24. The mask blank for extreme ultraviolet lithography of claim 23, wherein the phase shift layer is formed so that a content of Cr gradually decreases downward.

25. The mask blank for extreme ultraviolet lithography of claim 23, wherein the phase shift layer has a multi-layer structure of two or more layers, and
a lowermost layer of the phase shift layer is made of a material that has less Cr than at least one of other layers or does not contain Cr.

26. The mask blank for extreme ultraviolet lithography of claim 1, wherein the reflective layer comprises about 40 layers up to about 60 layers of Mo and Si.

27. The mask blank for extreme ultraviolet lithography of claim 1, wherein the phase shift layer comprises:
a first layer made of a material containing tantalum (Ta) and is configured to serve as an etch stop layer for the capping layer under the phase shift layer; and
a second layer formed on the first layer, the second layer being made of a material containing ruthenium (Ru) and chromium (Cr), and being configured to control the reflectance and phase shift amount of the phase shift layer.

28. The mask blank for extreme ultraviolet lithography of claim 27, wherein the first layer is made of a material further containing at least one of boron (B), niobium (Nb), titanium (Ti), molybdenum (Mo), and chromium (Cr).

29. The mask blank for extreme ultraviolet lithography of claim 27, wherein the first layer is made of a material further containing at least one of nitrogen, carbon, and oxygen.

30. The mask blank for extreme ultraviolet lithography of claim 29, wherein the first layer has a content of nitrogen of 50 at % or less.

31. The mask blank for extreme ultraviolet lithography of claim 27, wherein the first layer has a content of Ta of 50 at % or more and a thickness of 7 nm or less.

32. The mask blank for extreme ultraviolet lithography of claim 27, wherein the first layer is made of a material further containing boron (B), and
the phase shift layer has a relative reflectance of 14 to 15% with respect to the reflective layer.

33. The mask blank for extreme ultraviolet lithography of claim 27, wherein the first layer is made of a material further containing niobium (Nb), and
the phase shift layer has a relative reflectance of 20% or more with respect to the reflective layer.

34. A photomask manufactured using the mask blank for extreme ultraviolet lithography of claim 1.

* * * * *